(12) United States Patent
Ahrens et al.

(10) Patent No.: US 7,176,546 B2
(45) Date of Patent: Feb. 13, 2007

(54) DIODE CIRCUIT AND METHOD OF PRODUCING A DIODE CIRCUIT

(75) Inventors: Carsten Ahrens, Munich (DE); Wolfgang Hartung, Munich (DE); Holger Heuermann, Weyarn (DE); Reinhard Losehand, Munich (DE); Josef-Paul Schaffer, Munich (DE)

(73) Assignee: Infineon Technologies AG, Munich (DE)

( * ) Notice: Subject to any disclaimer, the term of this patent is extended or adjusted under 35 U.S.C. 154(b) by 106 days.

(21) Appl. No.: 10/865,509

(22) Filed: Jun. 10, 2004

(65) Prior Publication Data

US 2005/0040430 A1 Feb. 24, 2005

Related U.S. Application Data

(63) Continuation of application No. PCT/EP02/13138, filed on Nov. 22, 2002.

(30) Foreign Application Priority Data

Dec. 11, 2001 (DE) ................. 101 60 829

(51) Int. Cl.
*H01L 31/075* (2006.01)
(52) U.S. Cl. ................. 257/458; 257/656; 257/E29.336
(58) Field of Classification Search ................. 257/656, 257/458
See application file for complete search history.

(56) References Cited

U.S. PATENT DOCUMENTS

| | | | |
|---|---|---|---|
| 5,798,560 A | 8/1998 | Ohkawa et al. | |
| 6,027,956 A * | 2/2000 | Irissou | ................. 438/68 |
| 6,654,604 B2 * | 11/2003 | Yokogawa et al. | ......... 455/424 |
| 2001/0045617 A1 | 11/2001 | Xu et al. | |
| 2003/0062581 A1 | 4/2003 | Ahrens et al. | |
| 2003/0071325 A1 | 4/2003 | Xu et al. | |

FOREIGN PATENT DOCUMENTS

| | | |
|---|---|---|
| DE | 199 56 904 A1 | 5/2001 |
| EP | 0 054 648 A2 | 10/1981 |
| EP | 1 146 567 A1 | 4/2000 |
| EP | 1 160 850 A2 | 5/2001 |
| FR | 2 559 959 | 2/1984 |
| WO | WO 01/17032 A1 | 3/2001 |

OTHER PUBLICATIONS

Doherty, Bill, "PIN Diode Fundamentals," MicroNotes, Series 701, 2 pages.

(Continued)

*Primary Examiner*—Ahn D. Mai
*Assistant Examiner*—Brian E. Kunzer
(74) *Attorney, Agent, or Firm*—Maginot Moore & Beck

(57) ABSTRACT

A diode circuit includes a pin diode structure, wherein the n-semiconductor layer is a buried layer, on which the i-area is deposited by an epitaxy method, and wherein a p-semiconductor layer is introduced into the epitaxy layer. A contacting of the p-semiconductor layer and a contacting of the n-semiconductor layer are arranged on the same main surface of the semiconductor substrate so that an integration with an integrated capacitor, an integrated resistor and/or an integrated inductor is possible.

20 Claims, 2 Drawing Sheets

OTHER PUBLICATIONS

Berger, H. H., and K. P. Thiel, "Method of Producing Transistors with Optimum Base Contact," IBM Technical Disclosure Bulletin, vol. 23, No. 4, Sep. 1980, pp. 1487-1488,(2 pages).

Zurcher et al., "Integration of Thin Film MIM Capacitors and Resistors into Copper Metallization Based RF-CMOS and Bi-CMOS Technologies," IEEE,© 2000, pp. 153-156, (4 pages).

* cited by examiner

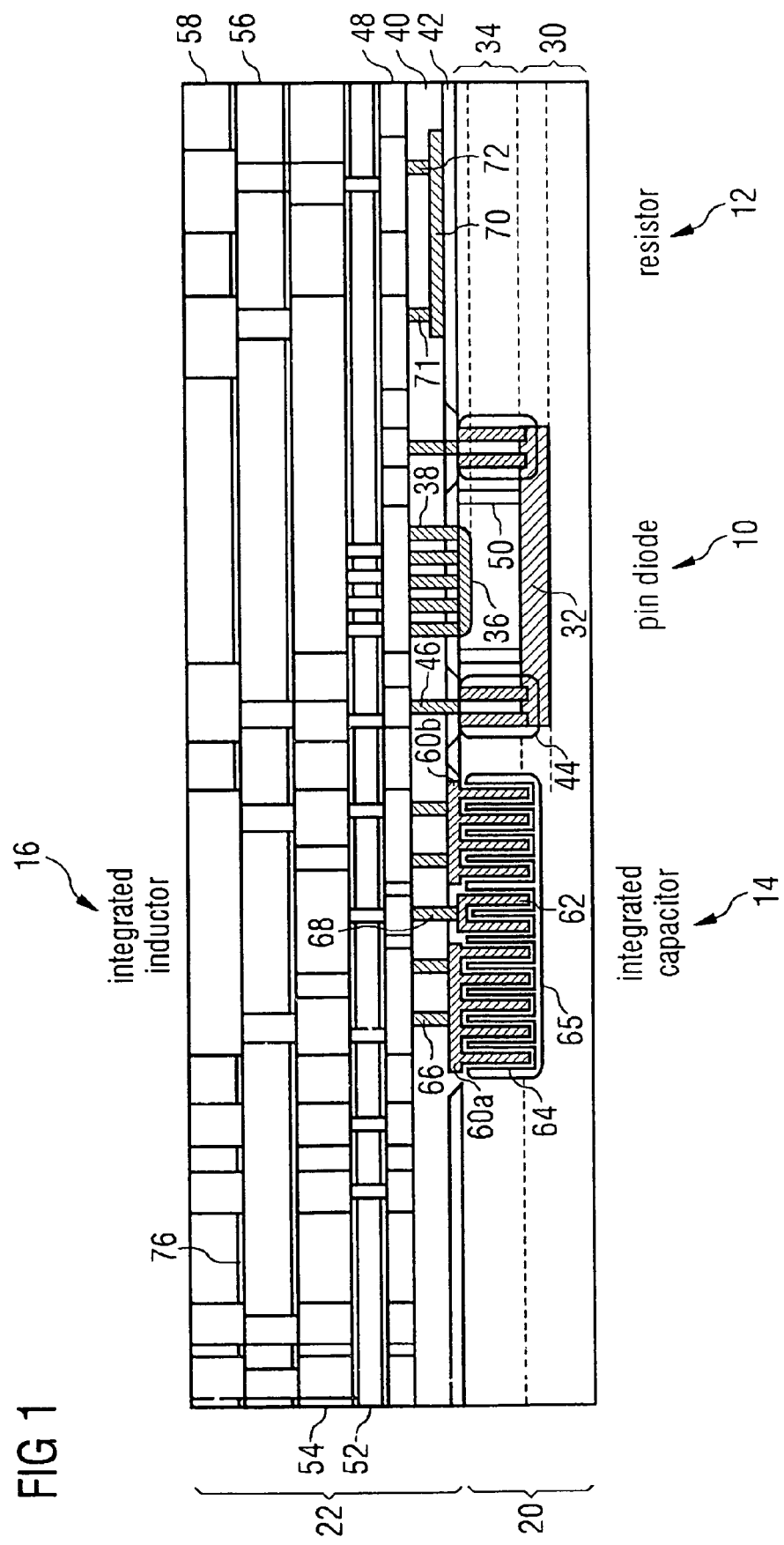

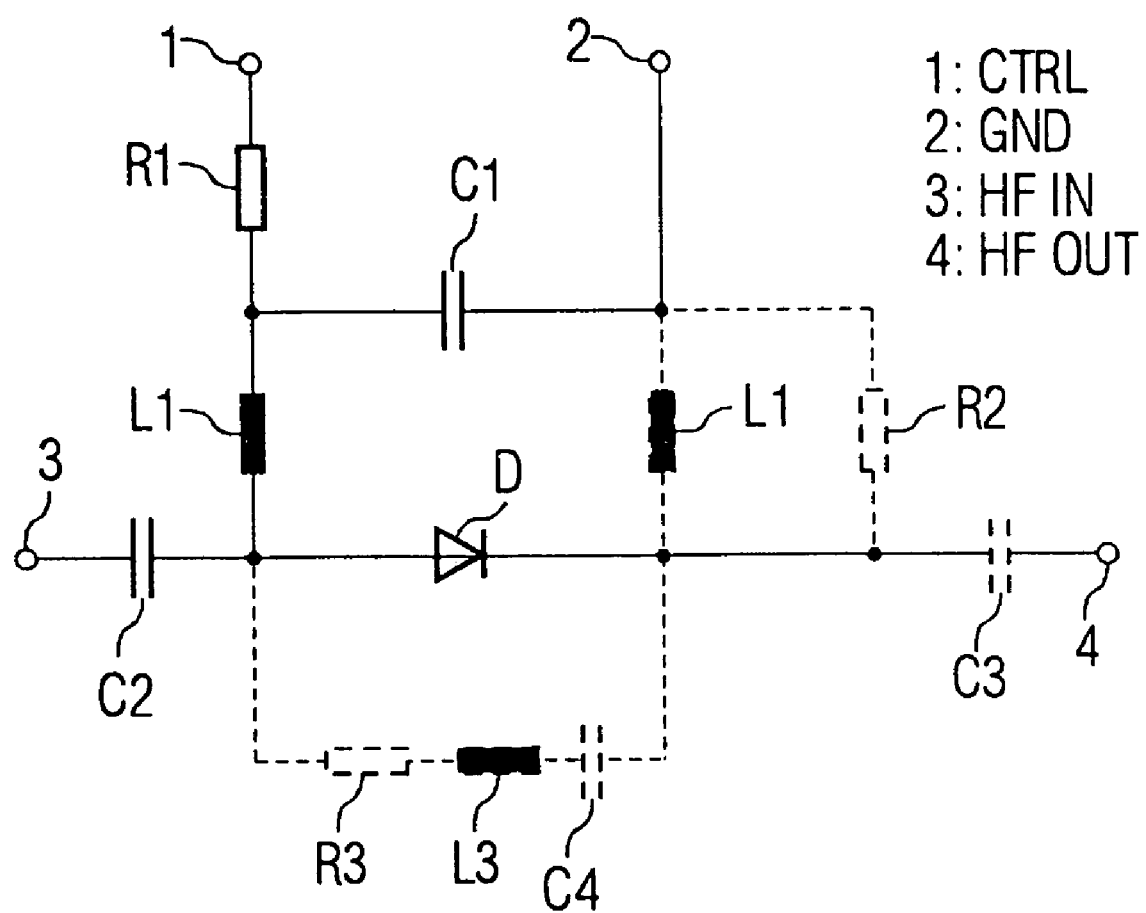

DIODE CIRCUIT AND METHOD OF PRODUCING A DIODE CIRCUIT

CROSS-REFERENCE TO RELATED APPLICATION

This application is a continuation of copending International Application No. PCT/EP02/13138, filed Nov. 22, 2002, which designated the United States and was not published in English.

BACKGROUND OF THE INVENTION

1. Field of the Invention

The present invention relates to diode circuits and, in particular, to integrated diode circuits.

2. Description of the Related Art

EP 1146567 A1 discloses a diode and a method of producing it. The diode is embodied as a pin diode and includes a heavily doped n-conducting silicon substrate onto which a lightly doped n-conducting region is deposited. A heavily doped p-conducting region is arranged on top of the lightly doped n-conducting region. The lightly doped region is formed by epitaxy on the heavily doped silicon substrate, wherein the heavily doped p-conducting region is produced by implantation in the epitaxy region. The pin diode formed in a circular shape in a plan view includes an insulation trench extending around the active diode structure and confining it. The diode is contacted by arranging an electrode on the heavily doped p-conducting region and by depositing, after back-side thinning, a back-side contact on the back surface of the heavily doped n-conducting silicon substrate. By providing the insulation trench, the extension of the depletion region and thus the area capacity of the diode are decoupled from the size of the upper electrode so that the extension of the depletion region can be chosen independently of the size of the electrode. This allows shorter switching on/off times which are particularly required when the pin diode is used as a high-frequency switch.

For installing such a diode into a circuit, it must be provided with an external HF coupling-in network and, additionally, with a bias feeding network so that it may be used in a high-frequency circuit. The semiconductor diode must thus be contacted externally to a high pass for the HF coupling-in, a high pass for the HF coupling-out and a low pass for the bias feed.

It is a disadvantage of this concept that the area consumption is relatively high. In addition, complicated and thus expensive processing steps are required in order to obtain a contacting of the external contacting, such as, for example, by bonding. In addition, the external contacting using bonding wires has the result that additional parasitic effects of which especially the inductivity of the bonding wires is problematic are introduced, which can, on the one hand, only be simulated and thus taken into consideration in the circuit design badly, and which, on the other hand, reduce the cutoff frequency of the entire circuit.

SUMMARY OF THE INVENTION

It is the object of the present invention to provide a diode circuit and a method of producing a diode circuit, which are less expensive and better as far as the area consumption is concerned.

In accordance with a first aspect, the present invention provides a diode circuit having: a semiconductor substrate having a main surface, wherein the semiconductor substrate has: a first semiconductor layer of a first doping type; a second semiconductor layer of a second doping type; and a third semiconductor layer disposed between the first and the second semiconductor layer, the concentration of free charge carriers of which is smaller than a concentration of free charge carriers of the first and the second semiconductor layer, wherein the second semiconductor layer is a layer buried into the semiconductor substrate, wherein the first semiconductor layer is disposed on the main surface of the semiconductor substrate, wherein a trench is present in the second semiconductor layer, the trench extending from the main surface of the semiconductor substrate at least partially to the buried layer; a first contacting for contacting the semiconductor layer arranged on the surface of the semiconductor substrate; and a second contacting for contacting the buried layer, wherein the contacting extends from the main surface of the semiconductor substrate to the buried layer, wherein the second contacting includes a heavily doped area in the second semiconductor layer, the area being spatially arranged around the trench in the second semiconductor layer, and wherein the trench is insulated from the heavily doped area by an isolator layer.

In accordance with a second aspect, the present invention provides a method of producing a diode circuit, having the following steps: providing a semiconductor substrate having a main surface, wherein the semiconductor substrate has: a first semiconductor layer of a first doping type; a second semiconductor layer of a second doping type; and a third semiconductor layer disposed between the first and the second semiconductor layer, the concentration of free charge carriers of which is smaller than a concentration of free charge carriers of the first and the second semiconductor layer, wherein the second semiconductor layer is a layer buried into the semiconductor substrate, wherein the first semiconductor layer is disposed on the main surface of the semiconductor substrate; producing a first contacting for contacting the semiconductor layer arranged on the surface of the semiconductor substrate; and producing a second contacting for contacting the buried layer, wherein the contacting extends from the main surface of the semiconductor substrate to the buried layer, wherein the step of producing the second contacting has the following steps: forming a trench through at least a part of the second semiconductor layer; doping an environment of the trench to produce a doped region in the environment of the trench extending to the third semiconductor layer; and insulating a surface of the trench by means of an insulation layer and filling the trench with a conductive material.

The present invention is based on the finding that a better and less expensive circuit can be obtained by integrating the diode together with the supply network. According to the invention, this becomes possible by the fact that a pin diode is produced, the electrodes of which for contacting the heavily doped n-region and for contacting the heavily doped p-region are arranged on the same surface of the semiconductor substrate. This is obtained by embodying either the p-region or the n-region as a "buried layer". The configuration in which both terminals for the diode are arranged on the same main surface of the semiconductor surface further makes it possible to integrate further circuits, such as, for example, a capacitor, a resistor or a coil, with the diode.

In order to make possible an integration of the diode and of a capacitor, the diode is formed on a high-resistance circuit substrate.

In a preferred embodiment, the buried layer is generated by implantation into the high-resistance substrate. The i-layer is grown on the buried layer by an epitaxy method. The heavily doped p-region is produced by doping an upper region of the epitaxy layer. The contacting for the buried layer is produced using a trench. With the help of this trench etching, an insulation trench for a plasma confinement the pin diode and an integrated capacitor, apart from the contacting of the buried layer, can be produced in the same substrate. When, apart from the trench for contacting the buried layer, an insulating trench and a trench capacitor are produced, the region of the epitaxy layer around the trench will at first be doped through the trench (except for the region of the insulating trench). Subsequently, the surface of the trench is provided with an insulation layer to obtain the capacitor dielectric. This has the result that the contacting trench or trenches for the buried layer are insulated as well. The current transport no longer takes place via the trenches subsequently filled with a conductive material but via the doped region around the contacting trenches. The trenches filled with a conductive material for contacting the buried layer are no longer suitable for transporting a current since they are insulated. It has, however, evolved that the current transport via the surroundings of the trenches is sufficient. Thus, no additional steps have to be performed to take the capacitor dielectric out of the "contacting trenches" again.

In another preferred embodiment of the present invention, an integrated resistor formed by a layer of the same material with which the trenches of the integrated capacitor are filled after doping and insulation is produced. Wiring can take place by means of a metallization sheet. When several metallization sheets are present, an integrated inductor which can also be connected by through holes filled with a metal to the diode, the capacitor and the resistor, as necessary, can also be produced on the metallization sheet.

BRIEF DESCRIPTION OF THE DRAWINGS

Preferred embodiments of the present invention will be detailed subsequently referring to the appendage drawings, in which:

FIG. 1 is a sectional view of an integrated circuit having a pin diode, an integrated capacitor, an integrated resistor and an integrated inductor; and FIG. 2 is a circuit diagram for illustrating a preferred integrated connection of the diode to passive elements which can be obtained via the metallization structure of FIG. 1.

DESCRIPTION OF PREFERRED
EMBODIMENTS

Before FIGS. 1 and 2 will be explained in greater detail, the general mode of operation of a pin diode will be referred to. Typically, a pin diode includes a lightly doped or non-doped intrinsic region. This intrinsic region usually has a large extension compared to the p-doped and the n-doped regions. When a cutoff voltage is applied to the pin diode, the i-region is quickly cleared of all free charge carriers and the space charge zone extends over the entire i-region. This has the effect that a pin diode has a very low cutoff capacity in the range between 200 and 300 fF in a reverse direction.

If the pin diode is, however, forward-biased, the i-region is flooded with charge carriers and the diffusion capacity between the p-region and the i-region is very large. In addition, the ohmic resistance of the diode is very low since the i-region is flooded with free charge carriers.

The pin diode can thus be thought of as a controlled resistor, wherein the controlled resistor, in the forward direction, has a very small value, and wherein the capacity in the flow direction is also very large. For a high-frequency signal applied to the pin diode, this means that, due to the small ohmic resistance, a little attenuation takes place and that the high diffusion capacity represents a short circuit for the high-frequency signal. For a reverse-biasing of the pin diode, the high-frequency signal, however, sees a very high ohmic resistance and a very small serial capacity. The pin diode thus represents a high-frequency switch which is closed when the diode is forward-biased and which is open when the diode is reverse-biased.

Subsequently, the inventive pin diode as well as the contacting to passive elements will be discussed referring to FIG. 1. FIG. 1 shows a cross-section of a semiconductor substrate having a pin diode 10, an integrated resistor 12, and integrated capacitor 14 and an integrated inductor 16. In a plan view, the pin diode could, for example, be embodied in the form of a circle or of a rectangle. This, in principle, also holds true for the resistor, the integrated capacitor and the integrated inductor, wherein for reasons of simplicity a rectangular form, in a plan view, is chosen for the integrated resistor.

The integrated circuit shown in FIG. 1 includes a semiconductor substrate 20 and a metallization structure 22, wherein the metallization structure 22 is deposited on the semiconductor substrate 20 after producing same. The semiconductor substrate 20 is produced by providing a base semiconductor substrate 30. A layer 32 is formed in the base semiconductor substrate 30, for example by implantation, which will later—after the epitaxy—serve as the buried layer. In the preferred embodiment of the present invention, the buried layer 32 is a heavily n-doped layer. As can be seen from FIG. 1, the heavily n-doped layer is confined to the region of the pin diode 10. No such buried layer 32 is present below the integrated capacitor 14 and the integrated resistor 12 and the integrated inductor. It is to be pointed out that the base semiconductor substrate 30 preferably is a high-resistance substrate so that, for example, the integrated capacitor 14 is, in a certain sense, insulated from the integrated pin diode automatically. The production of a heavily doped layer 32 in a region of the surface of the base semiconductor substrate 30 can, for example, be produced by photo-lithographic techniques and ion implantation, such as, for example, by ion diffusion.

By means of epitaxial methods, a third semiconductor layer 34, which is lightly n-doped or even intrinsic, i.e. the doping concentration of which is usually smaller by several orders of magnitude than the doping concentration of the buried layer 32 and, of course, also than the doping concentration of a first semiconductor layer 36, is grown on the buried layer 32 forming a second semiconductor layer having a second doping type n. The first semiconductor layer 36, which is usually heavily p-doped, is produced by doping a localized region in the second semiconductor layer 34. The pin diode thus includes a p-layer 36, followed by an i-layer 34, which is in turn followed by an n-layer 32 in the semiconductor substrate 20. The first semiconductor layer 36, which is p-doped in the preferred embodiment shown in FIG. 1, is contacted by a first contacting 38. The first contacting 38 includes through holes filled with tungsten through a first isolator layer 40 and a second isolator layer 42.

The buried layer 32 is contacted by means of a second contacting including a region 44 doped in the second semiconductor layer 34, which will be explained later. The second contacting further also includes a through hole 46 filled with a tungsten material which can be wired to other elements as is also the case with the first contacting 38 by means of a wiring level 48. The regions of the wiring level 48 left free should, for example, include copper regions, while the regions shown in a hatched manner in FIG. 1 are to symbolize an isolator layer. In a preferred embodiment of the present invention, the pin diode further includes an insulation trench 50 extending around the active i-region, which makes possible a charge carrier confinement in forward-biased pin diode and thus leads to short switching on/off times, as is described in EP 1146567 A1.

The metallization structure 22 shown in FIG. 1 further includes, apart from the cross-wiring level 48 which is also referred to as the first metallization level, a first via level 52, a second metallization level 54, a second via level 56 and a third metallization level 58. The level formed by the layers 40 and 42 is also referred to as the tungsten level since the tungsten plugs of the first and the second contacting are formed there.

In a preferred embodiment of the present invention, the following vertical dimensions are preferred for the individual levels. The metallization level M1 (48) usually has an extension of 600 nm. The first via level 52 usually has an extension of 900 nm. The second metallization level M2 (54) usually has an extension of 2.5 µm. The second via level 56 usually has an extension of 1 to 2 µm. The third metallization level M3 (58) usually has an extension of 2.5 µm.

The integrated capacitor will be dealt with in detail subsequently. The integrated capacitor includes a first capacitor electrode 60a, 60b and a second capacitor electrode 62. The capacitor dielectric is formed by an isolator layer 64. The first capacitor electrode 60a/60b is connected to the cross-wiring level 48 by one or several tungsten plugs 66. The same applies to the second capacitor electrode 62 which is also connected to the cross-wiring level 48 by means of a tungsten plug 68.

The first capacitor electrode 60a/60b includes trenches filled with a conductive material, such as, for example, heavily doped n⁺ polysilicon. They are surrounded by a heavily doped region 65 surrounding the trenches in the epitaxy layer 34 via the isolator layer 64, wherein this heavily doped region 65 in a certain sense forms the second capacitor electrode. The trenches 62 thus do not serve for transporting a current, but the areas around the trenches 62 which are connected to the tungsten plug 68 in an electrically conductive way do so. The trenches 62 are thus so-called dummy trenches which themselves do not contribute to transporting a current since they are electrically insulated from the surrounding conductive region 65 by the isolator layer 64, but they are required for generating the heavily doped region 65. Here, the same principle as in the second contacting of the buried layer of the pin diode is utilized, where the trenches are also required for producing the conductive region 44, but, as soon as the circuit is completed, cannot be used for transporting a current since it would be complicated in the preferred embodiment of the present invention to remove the insulation material which serves as a capacitor dielectric from the trenches, although this could be performed in principle.

The integrated inductor 16 is usually formed in the metallization levels M3 (58) and/or M2 (54) and is usually formed in a spiral form. It can either extend in a metallization level, wherein both terminals can be pulled to the wiring level 48 by via holes. The inductor can also be arranged in two metallization levels, wherein the internal terminal of the spiral can, for example, be pulled down to the second metallization level 54 via the via level 56 from the third metallization level 58 in order to prevent a so-called bridge required in an inductor which is arranged in a single metallization level and can only be contacted on one side.

The integrated resistor includes a region 70 defining a resistor as well as a first terminal 71 and a second terminal 72. The region 70 defining a resistor is defined on the lower insulation layer 42 and pulled to the wiring level 48 by the tungsten plugs 71 and 72. The material of the region 70 is preferably the same material as is filled into the trenches of the integrated capacitor and the pin diode or the contacting of the buried layer of the pin diode.

The production of the circuit shown in FIG. 1 according to a preferred embodiment of the present invention will be dealt with subsequently.

At first, a high-resistance base semiconductor substrate 30 is provided, in which the localized buried layer 32 is then produced by n-doping. Subsequently, the low-resistance epitaxy layer 34 is grown on the entire base semiconductor substrate, i.e. on the buried layer and in the sub regions where the base semiconductor substrate does not have a high doping. Subsequently, the first heavily p-doped semiconductor layer 36 is formed in the epitaxy layer, whereupon the entire surface of the semiconductor substrate 20 now present is provided with the isolator layer 42. In areas where trench etching for the first contacting, the second contacting and the capacitor is to take place, the isolator layer 42 is removed. Then, trench etching is performed, wherein the trenches extend at least partially through the third semiconductor layer 34, i.e. the epitaxy layer. When insulation trenches 50 are used, the trenches must extend through the entire epitaxy layer 34. When insulation trenches 50 are not used, the trenches must extend through the epitaxy layer to an extent that the area doped through the trenches "reaches" the buried layer 32.

After etching the trenches for both the contacting of the buried layer 32 and for the capacitor structure, a PoCl diffusion is preferably used to heavily dope the areas 65 and 44 around the trenches. After doping has been completed, an isolated layer having the effect of a capacitor dielectric is grown in areas where there are trenches. This isolator layer is also introduced into the trenches of the second contacting 44 since these trenches would have to be covered otherwise, which would lead to further complicated and expensive steps. Subsequently, after depositing the isolator layer 64, the trenches are filled with a conductive material. In this step, the area 70 of the resistor 12 consisting of the same material as can be found in the trenches is produced. Here n⁺-doped polysilicon is the preferred material. After that, the second isolator layer 42 is deposited over the entire resulting structure. Subsequently, the through holes for the tungsten plugs are defined in this layer, produced and filled with tungsten. Subsequently, the further layers 48, 52, 54, 56 and 58 are produced by always manufacturing a thin isolator layer (e.g. 76) between the layers, on which a thick isolator layer is then deposited in which the desired material structures for the through hole contacting, the integrated inductor or the wiring level are generated.

FIG. 1 only shows a principal arrangement of diode, capacitor, resistor and coil (inductor) in an integrated circuit without the individual elements being connected to one another. The wiring of the elements preferably occurs in the wiring level 48, but can also occur in any other level arranged above the wiring level 48. The HF input, the HF output, the control input and the control output (the circuit ground) are typically realized in the third metallization level 58 since it is available to the exterior. If the integrated pin diode shown in FIG. 1 is, however, a part of a larger circuit, the inputs/outputs may also be realized on another level since they are controlled by neighboring components within the metallization structure 22.

A preferred embodiment for a passive contacting will be explained in greater detail subsequently referring to FIG. 2. An input referred to as "1," represents a control input (CTRL) for applying a supply voltage for the diode. A second input which, in FIG. 2, is referred to as "2" represents the ground input (GND). A third input which in FIG. 2 is referred to as "3" is provided to feed a high-frequency input signal (HF IN). The HF output signal (HF OUT) can be output at an output which in FIG. 2 is referred to as "4".

A resistor R1 is provided to convert a voltage applied at the input "1" into a supply current for the diode D. A capacity C1 and an inductivity L1 form a low pass for the diode supply current. The direct current decoupling of the input 3 takes place with a capacitor C2. It is also preferred to provide another coil L2 between an output of the diode D and ground to make possible a direct current return path when the direct current return path is not to take place via the output 4 of the circuit. In this case, a serial capacity C3 can also be provided between the output 4 and a cathode (i.e. buried n-layer). Another resistor R2 additionally preferably serves to make possible a dissipation of charges stored in the diode to ground, whereby switching-off times can be improved.

It is also preferred to connect an inductivity L3 in parallel to the diode D, the inductivity being sized such that it forms a parallel resonance circuit with a cutoff capacity of the diode D when same is operated in the reverse direction, i.e. negatively biased, with a resonant frequency equaling the mean operating frequency of the HF signal applying at the input 3. Thus, the cutoff behavior of the diode, i.e. the impedance of the diode in the reverse direction, can be increased since the parallel resonance circuit being in resonance theoretically has an unlimited high resistance. As further design parameters, a resister R3 and a capacitor C4 can be used to take parasitic elements of the coil L3 into account or to obtain, generally considering all the other elements of the circuit shown in FIG. 2, the smallest possible forward transfer parameter from the HF input 3 to the HF output 4 when the diode is operated in the reverse direction, i.e. when the inventive integrated pin switch is open.

The discrete elements shown in FIG. 2 can be realized on a single semiconductor substrate with the technology illustrated in FIG. 1 and can be connected to one another according to the circuit diagram shown in FIG. 2 to obtain an integrated diode circuit having an HF coupling-in network, HF coupling-out network and bias network.

The inventive concept is of advantage in that separate inputs/outputs for HF and DC bias are provided, in that area can be saved by the inventive monolithic integration and in that, by means of the monolithic integration the circuit can be manufactured cheaper and with fewer parasitic effects than in the case that the diode connection takes place by means of external elements.

This is made possible by the fact that the pin diode includes a lateral contact arrangement by contacting a buried layer and that the integrated capacitor and the integrated resistor can be integrated into the manufacturing process of the pin diode and that additionally a high-resistance substrate can be utilized so that even integrated inductors having a high quality can be produced since no large eddy current losses occur as is the case in a low-resistance substrate.

It is to be pointed out here that coils having a high quality can be obtained in particular when, contrary to the representation in FIG. 1, the smallest possible number of metallization structures and, in particular, no low-resistance area of a capacitor are present below the inductivity.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A diode circuit comprising:
   a semiconductor substrate having a main surface, wherein the semiconductor substrate comprises:
   a first semiconductor layer of a first doping type;
   a second semiconductor layer of a second doping type; and
   a third semiconductor layer disposed between the first and the second semiconductor layer, the concentration of free charge carriers in the third semiconductor layer smaller than a concentration of free charge carriers of the first and the second semiconductor layer,
   wherein the second semiconductor layer is a buried layer in the semiconductor substrate,
   wherein the first semiconductor layer is disposed on the main surface of the semiconductor substrate;
   wherein a trench is present in the third semiconductor layer, the trench extending from the main surface of the semiconductor substrate at least partially to the buried layer,
   a first contact for contacting the first semiconductor layer disposed on the main surface of the semiconductor substrate;
   a second contact for contacting the buried layer, wherein the second contact extends from the main surface of the semiconductor substrate to the buried layer, wherein the second contact includes a heavily doped area in the third semiconductor layer, the heavily doped area being spatially arranged around the trench in the third semiconductor layer, wherein the trench includes an isolator layer; and
   an insulation trench extending from the main surface of the semiconductor substrate to the buried layer and essentially surrounding the first semiconductor layer, wherein the second contact is arranged outside the insulation trench and extends through the third semiconductor layer.

2. The diode circuit according to claim 1,
   further comprising a capacitor integrated in the semiconductor substrate, the capacitor comprising a first electrode and a second electrode which are both arranged on the main surface of the semiconductor substrate.

3. The diode circuit according to claim 2, wherein the capacitor further comprises:
   a capacitor trench in the third semiconductor layer;
   a doped area in the third semiconductor layer arranged around the capacitor trench;
   an isolator layer in the capacitor trench;
   a conductive material on the insulation layer in the capacitor trench,
   wherein the first electrode is connected to the conductive material in the capacitor trench, and
   wherein the second electrode is connected to the doped area disposed around the capacitor trench.

4. The diode circuit according to claim 1,
further comprising an integrated resistor separated from the semiconductor substrate by an isolator layer on the main surface of the semiconductor substrate, the integrated resistor comprising an area made of an electrically conductive material.

5. The diode circuit according to claim 4, wherein the area made of an electrically conductive material comprises a material which is the same as a material in a capacitor trench provided in the third semiconductor layer or as a material in a trench which is used for the second contact.

6. The diode circuit according to claim 1,
further comprising an integrated inductor separated from the semiconductor substrate by at least one isolator layer.

7. The diode circuit according to claim 6,
wherein the inductor comprises:
at least one turn;
a first terminal connected to an end of the turn;
a second terminal connected to another end of the turn, wherein the at least one turn is formed as a conductive area in a layer which, in relation to the main surface of the semiconductor substrate, is arranged above the at least one isolator layer.

8. The diode circuit according to claim 1, further comprising a wiring structure including a wiring level, wherein the wiring level is separated from the main surface of the semiconductor substrate by at least one isolator layer,
wherein the wiring structure comprises traces within another isolator layer on the at least one isolator layer.

9. The diode circuit according to claim 1 wherein the diode circuit is formed as an integrated circuit comprising:
a high frequency (HF) input terminal for an HF input signal;
an HF output terminal for an HF output signal;
a control terminal for applying a supply voltage to the first contact or the second contact;
a ground terminal for applying a mass potential to the second or first contact,
an integrated resistor between the control terminal and an intermediate node;
a first integrated inductor between the intermediate node and the first contact;
a first integrated capacitor between the intermediate node and the ground terminal; and
a second integrated capacitor between the HF input terminal and the first contact.

10. The diode circuit according to claim 9, wherein a second inductor and, in series with the second inductor, a third capacitor are connected between the first and the second contacts,
wherein the second inductor is sized such that it forms a resonance circuit with a cutoff capacity with a reverse-biasing between the first and the second semiconductor layer, the resonance circuit having a resonance frequency which is close to an operating frequency of the high-frequency voltage applying at an HF input terminal.

11. The diode circuit according to claim 9,
wherein a second inductor is disposed between the second contact and the ground terminal,
wherein a second resistor is connected between the second semiconductor layer and the ground terminal; and
wherein a third capacitor is connected between the second semiconductor layer and the HF output terminal.

12. A diode circuit comprising:
a semiconductor substrate having a main surface, wherein the semiconductor substrate comprises:
a first semiconductor layer of a first doping type;
a second semiconductor layer of a second doping type; and
a third semiconductor layer disposed between the first and the second semiconductor layer, the concentration of free charge carriers in the third semiconductor layer smaller than a concentration of free charge carriers of the first and the second semiconductor layer,
wherein the second semiconductor layer is a buried layer in the semiconductor substrate,
wherein the first semiconductor layer is disposed on the main surface of the semiconductor substrate;
wherein a trench is present in the third semiconductor layer, the trench extending from the main surface of the semiconductor substrate at least partially to the buried layer,
a first contact for contacting the first semiconductor layer disposed on the main surface of the semiconductor substrate;
a second contact for contacting the buried layer, wherein the second contact extends from the main surface of the semiconductor substrate to the buried layer, wherein the second contact includes a heavily doped area in the third semiconductor layer, the heavily doped area being spatially arranged around the trench in the third semiconductor layer, and
wherein the trench includes an isolator layer and conductive material, the isolator layer insulating the conductive material in the trench from the heavily doped area.

13. A diode circuit comprising:
a semiconductor substrate having a main surface, wherein the semiconductor substrate comprises:
a first semiconductor layer of a first doping type;
a second semiconductor layer of a second doping type; and
a third semiconductor layer disposed between the first and the second semiconductor layer, the concentration of free charge carriers in the third semiconductor layer smaller than a concentration of free charge carriers of the first and the second semiconductor layer,
wherein the second semiconductor layer is a buried layer in the semiconductor substrate,
wherein the first semiconductor layer is disposed on the main surface of the semiconductor substrate;
wherein a trench is present in the third semiconductor layer, the trench extending from the main surface of the semiconductor substrate at least partially to the buried layer,
a first contact for contacting the first semiconductor layer disposed on the main surface of the semiconductor substrate;
a second contact for contacting the buried layer, wherein the second contact extends from the main surface of the semiconductor substrate to the buried layer, wherein the second contact includes a heavily doped area in the third semiconductor layer, the heavily doped area being spatially arranged around the trench in the third semiconductor layer,
wherein the trench includes an isolator layer; and
a capacitor integrated in the semiconductor substrate, the capacitor comprising a first electrode and a second electrode which are both arranged on the main surface of the semiconductor substrate.

14. A diode circuit comprising:
a semiconductor substrate having a main surface, wherein the semiconductor substrate comprises:
a first semiconductor layer of a first doping type;
a second semiconductor layer of a second doping type; and
a third semiconductor layer disposed between the first and the second semiconductor layer, the concentration of free charge carriers in the third semiconductor layer smaller than a concentration of free charge carriers of the first and the second semiconductor layer,
wherein the second semiconductor layer is a buried layer in the semiconductor substrate,
wherein the first semiconductor layer is disposed on the main surface of the semiconductor substrate;
wherein a trench is present in the third semiconductor layer, the trench extending from the main surface of the semiconductor substrate at least partially to the buried layer,
a first contact for contacting the first semiconductor layer disposed on the main surface of the semiconductor substrate;
a second contact for contacting the buried layer, wherein the second contact extends from the main surface of the semiconductor substrate to the buried layer, wherein the second contact includes a heavily doped area in the third semiconductor layer, the heavily doped area being spatially arranged around the trench in the third semiconductor layer,
wherein the trench includes an isolator layer; and
an integrated resistor separated from the semiconductor substrate by an isolator layer on the main surface of the semiconductor substrate, the integrated resistor comprising an area made of an electrically conductive material; wherein the area made of an electrically conductive material comprises a material which is the same as a material in a capacitor trench provided in the third semiconductor layer or as a material in the trench which is used for the second contact.

15. A diode circuit comprising:
a semiconductor substrate having a main surface, wherein the semiconductor substrate comprises:
a first semiconductor layer of a first doping type;
a second semiconductor layer of a second doping type; and
third semiconductor layer disposed between the first and the second semiconductor layer, the concentration of free charge carriers in the third semiconductor layer smaller than a concentration of free charge carriers of the first and the second semiconductor layer,
wherein the second semiconductor layer is a buried layer in the semiconductor substrate,
wherein the first semiconductor layer is disposed on the main surface of the semiconductor substrate;
wherein a trench is present in the third semiconductor layer, the trench extending from the main surface of the semiconductor substrate at least partially to the buried layer,
a first contact for contacting the first semiconductor layer disposed on the main surface of the semiconductor substrate;
a second contact for contacting the buried layer, wherein the second contact extends from the main surface of the semiconductor substrate to the buried layer, wherein the second contact includes a heavily doped area in the third semiconductor layer, the heavily doped area being spatially arranged around the trench in the third semiconductor layer,
wherein the trench includes an isolator layer; and
wherein the diode circuit is formed as an integrated circuit, the integrated circuit further comprising:
a high frequency (HF) input terminal for an HF input signal;
an HF output terminal for an HF output signal;
a control terminal for applying a supply voltage to the first contact or the second contact;
a ground terminal for applying a mass potential to the second or first contact;
an integrated resistor between the control terminal and an intermediate node;
a first integrated inductor between the intermediate node and the first contact;
a first integrated capacitor between the intermediate node and the ground terminal; and
a second integrated capacitor between the HF input terminal and the first contact.

16. The diode circuit according to claim 12,
further comprising a capacitor integrated in the semiconductor substrate, the capacitor comprising a first electrode and a second electrode which are both arranged on the main surface of the semiconductor substrate.

17. The diode circuit according to claim 16, wherein the capacitor further comprises:
a capacitor trench in the third semiconductor layer;
a doped area in the third semiconductor layer arranged around the capacitor trench;
an isolator layer in the capacitor trench;
a conductive material on the insulation layer in the capacitor trench,
wherein the first electrode is connected to the conductive material in the capacitor trench, and
wherein the second electrode is connected to the doped area disposed around the capacitor trench.

18. The diode circuit according to claim 12,
further comprising an integrated resistor separated from the semiconductor substrate by an isolator layer on the main surface of the semiconductor substrate, the integrated resistor comprising an area made of an electrically conductive material.

19. The diode circuit according to claim 18, wherein the area made of an electrically conductive material comprises a material which is the same as a material in a capacitor trench provided in the third semiconductor layer or as the conductive material in the trench.

20. The diode circuit according to claim 12,
further comprising an integrated inductor separated from the semiconductor substrate by at least one isolator layer.

* * * * *